United States Patent [19]

Graziadei et al.

[11] Patent Number: 4,704,738
[45] Date of Patent: Nov. 3, 1987

[54] TRANSISTOR AMPLIFIER AND MIXER INPUT STAGE FOR A RADIO RECEIVER

[75] Inventors: Rinaldo Graziadei, Monza; Michaelango Lorusso, Carbonara, both of Italy

[73] Assignee: SGS Microelettronica S.p.A., Agrate, Italy

[21] Appl. No.: 657,572

[22] Filed: Oct. 1, 1984

[30] Foreign Application Priority Data

Sep. 29, 1983 [IT] Italy ................................ 23043 A/83

[51] Int. Cl.[4] ............................................. H04B 1/26
[52] U.S. Cl. .................................... 455/253; 455/249; 455/326; 455/332; 455/333; 330/254; 330/284; 332/43 B
[58] Field of Search ................ 330/284, 254; 455/253, 455/249, 326, 332, 333; 332/43 B

[56] References Cited

U.S. PATENT DOCUMENTS

| 3,431,506 | 3/1969 | Hirscfield et al. | 330/284 |
| 4,301,455 | 11/1981 | Robinson | 455/249 |

FOREIGN PATENT DOCUMENTS 3234240 3/1983 Fed. Rep. of Germany ...... 455/333

Primary Examiner—Robert L. Griffin
Assistant Examiner—Elissa Seidenglanz
Attorney, Agent, or Firm—Harry M. Weiss & Associates

[57] ABSTRACT

The input stage of a radio receiver incudes a differential amplifier circuit, whose gain is adjusted by a voltage generated by an AGC circuit, and a mixer circuit. An attenuator stage with a predetermined attenuation coefficient is coupled between the input terminal of differential circuit and the input terminal of the mixer circuit. When the level of the input signal increases beyond a given value, the differential amplifier circuit is deactivated and the signal reaches the mixer circuit through the attenuator stage.

14 Claims, 2 Drawing Figures

TRANSISTOR AMPLIFIER AND MIXER INPUT STAGE FOR A RADIO RECEIVER

BACKGROUND OF THE INVENTION

This invention relates to receivers of radio frequency signals, and, in particular, to a transistor amplifier and mixer input stage for a receiver that can be implemented in integrated circuit technology.

The dynamics of a receiver's input stage, i.e., the difference between maximum and minimum input signal levels that can be accepted without introducing appreciable distortion, are limited in its lower signal level range by input stage sensitivity and in its upper range by the deviation from the linearity of the transfer characteristic of the input stage.

A number of devices are known to control or modify the input stage circuit in a simple way in order to expand upwards the input signal dynamics. In particular, one device is described in the Italian Patent Application No. 23984 A/81, filed on Sept. 16, 1981 and assigned to the assignee of the instant U.S. patent application which will be referred to later in this description. This device, while fully satisfying the above-mentioned goal, has the disadvantage of causing transients thereby producing nonlinearity in the input stage function and discontinuity in the gain. These phenomena can cause a distortion of the signal and can lower the signal output level. Furthermore, the device does not work properly with power supplies under 2 Volts.

SUMMARY

It is therefore an object of the present invention to create an input stage for a radio receiver that can have high input signal dynamics, can function in a linear mode and with no gain discontinuity throughout the entire input signal variation range, can be very simple in implementation and can operate with supply voltages below those required by the state of the art.

This goal is achieved by providing the input stage defined and characterized in the claims that conclude the present description.

According to one embodiment of the present invention, a transistor amplifier and mixer input stage for a receiver of radio frequency signals is disclosed that includes a differential amplifier, a mixer circuit and an attenuator. The differential amplifier (T1-T4) has the differential amplifier input terminals coupled to the output of a radio frequency signal generator (RF) and a regulating terminal coupled to a AGC circuit of the receiver. This AGC circuit generates at least one voltage (V1, V2) varying as a function of the average level of the radio frequency signal. The voltage adjusts automatically the amplifier gain. The mixer circuit (T5-T11) has a first input terminal coupled to the differential output terminals of the differential amplifier (T1-T4), a second input terminal coupled to oscillator (OS) an output terminal that is the output stage terminal. An attenuator (T12, T13, R7-R10) is coupled between the radio frequency signal generator (RF) and the mixer circuit (T5-T11), the attenuator having a predetermined attenuation coefficient.

These and other features of the invention will be understood by reading the following description along with the drawings.

DESCRIPTION OF THE PREFERRED EMBODIMENT

Figure 1:
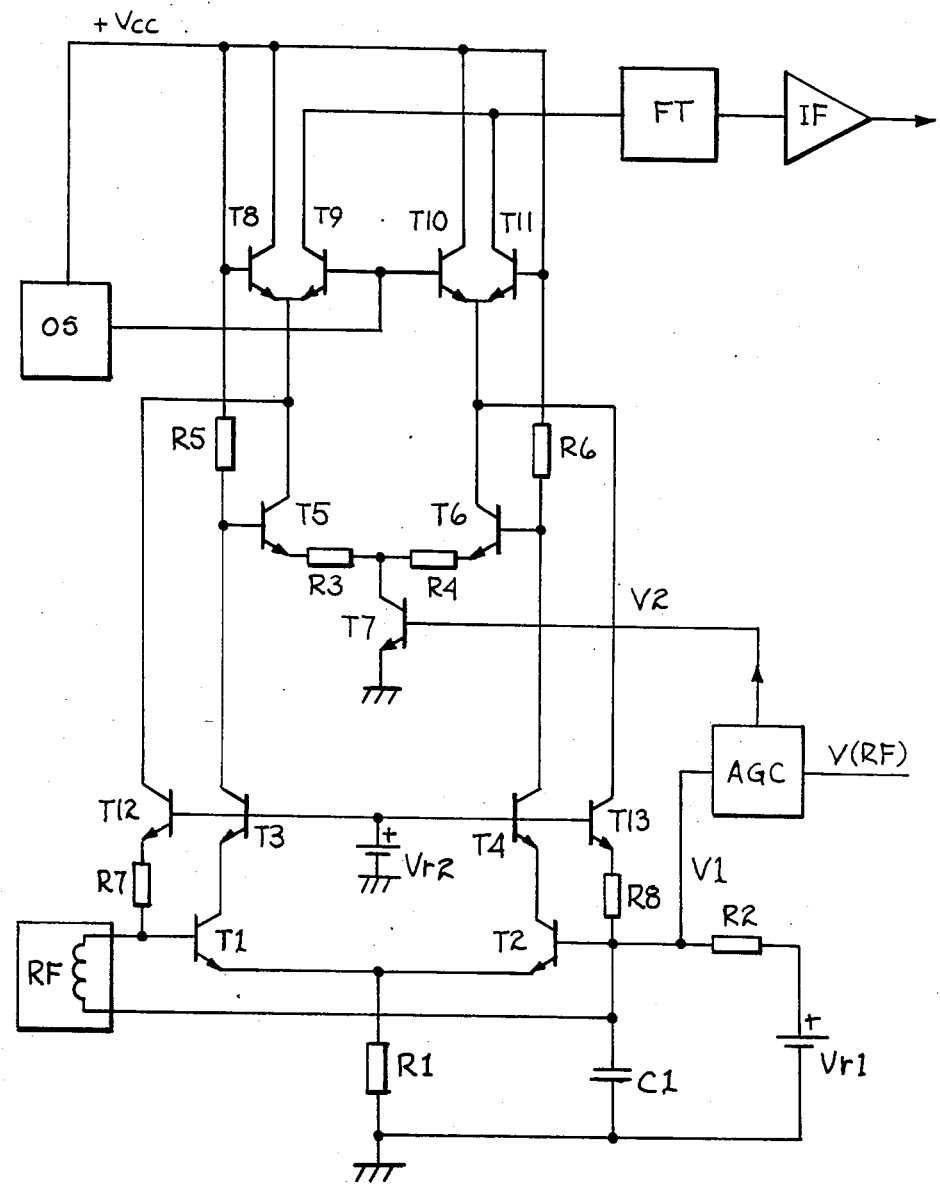
FIG. 1 shows a simplified circuit diagram of an amplifier circuit and mixer circuit input stage of the kind described in the above-identified Italian patent application.

Referring now to FIG. 1, the input stage contains a first differential amplifier of the kind known by the name "cascode" differential amplifier and commonly used in wideband radio frequency input stages. It includes two pairs of npn transistors T1, T2 and T3, T4. Transistors T1 and T2 of the first pair have their emitters coupled together and through resistor R1, to a voltage power supply negative terminal represented by the symbol for system ground. Each of transistor bases is coupled to a terminal of a radio frequency signal source, for example, an antenna transformer shown on the drawing by a coil inside a block, marked RF. The bases of transistors T1 and T2 are also coupled coupled together and the resulting terminal is coupled through resistor R2 to the positive terminal to reference voltage supply Vr1. The base of transistor T2 is also grounded through a condenser C1, which constitutes a short circuit for the radio frequency input signal. The collectors of transistors T1 and T2 are coupled to the emitters of transistors T3 and T4 respectively; and the bases of transistors T3 and T4 are coupled together to the positive terminal of a reference voltage supply Vr2. A second differential amplifier includes two npn transistors T5 and T6, whose emitters are coupled through linearizing resistors R3 and R4, respectively, to the collector of an npn transistor T7, the emitter of transistor T7 being grounded. Transistor T7 functions as a current generator. The bases of transistor T5 and T6 are coupled to the collector of T3 and to the collector of T4 respectively and are both coupled to the $+V_{cc}$ (positive) terminal of the power supply through resistors R5 and R6 respectively. An auxiliary input stage contains two npn transistors T12 and T13, the bases of transistors T12 and T13 being coupled to the bases of transistors T3 and T4. The collectors of transistors T12 and T13 are connected to the collectors of transistors T5 and T5 respectively. The emitters of transistors T12 and T13 are respectively coupled to the base of transistor T1 through resistor R7, and to the base of transistor t2 through resistor R8. The two transistor T12 and T13 are coupled in the common base configuration and therefore have a current gain lower than one (1), i.e., they act as an attenuator stage for the input signal. This attenuator input stage, as it will be explained later in this description, is inactive at low average radio frequency input signal levels, while it conducts, when the average level of the input signal is high by shunting the amplifier input stage consisting of the first and second differential amplifiers.

The input terminals of the first differential amplifier, i.e., the bases of transistors T1 and T2, and the input terminals of the attenuator, i.e., the emitters of transistors T12 and T13, are coupled across resistors R7 and R8 respectively to an output of a circuit, represented by the block labelled AGC. The base of transistor T7 is coupled to the second output of the block AGC. The circuit represented by the block AGC, generates two direct voltages, V1 and V2, whose amplitudes depend on the level of the radio frequency input signal. To represent this dependency, the input terminal of the block AGC, is indicated on the drawing by V(RF).

Two pairs of equal npn transistors T8, T9 and T10, T11 are coupled to one another in such a way as to form a double balanced mixer circuit. Specifically, the emitters of the transistor pair T8, T9 are coupled together and to to the collectors of transistors T5 and T12 and the emitters of the transistor pair T10, T11 are coupled together and to the collectors of transistors T6 and T13. The two terminals of a first mixer circuit input signal are therefor, for low average radio frequency input signal levels, the second differential amplifier input terminals, i.e., the bases of transistors T5 and T6; while for high average radio frequency input signal levels, the two input terminals of the first mixer circuit are the attenuator stage input terminals, i.e., the emitters of transistors T12 and T13. The bases of transistors T9 and T10, coupled to one other, form a terminal of a second mixer circuit input. The second mixer circuit has as a second terminal the $+V_{cc}$ positive pole of the supply.

An oscillator, represented by a block, OS, in the drawing is connected to the second mixer input. The frequency of the oscillator is variable in relation to the frequency of the signal tuned in block RF in a way that is well known to those skilled in this art and therefore is neither described nor shown in the drawing.

The base and the collector of transistor T8, the collector of transistor T10 and the base of transistor T11 are coupled to the $+V_{cc}$ supply terminal. The collectors of transistors T9 and T11, joined together, form the mixer circuit stage output and are coupled across a band pass filter FT, to the input of an intermediate frequency amplifier stage, represented by a block IF in the drawing.

The circuit described above works in the following manner. A radio frequency signal, tuned in the block RF, when having a low average level, is amplified in the amplifier input stage, including the two differential amplifier circuits (T1-T4; T5, T6) and inserted into the mixer circuit (T8-T11). In the mixer circuit, the radio frequency signal is combined with the signal arriving from the oscillator OS and applied at the second input of the same mixer circuit. A complex radio frequency signal is produced at the mixer circuit output terminal and contains two components whose frequencies are equal to the sum and the difference of the input signal frequency and the oscillator OS frequency. This signal is filtered in filter FT, amplified in intermediate frequency amplifier IF, and then processed further in other circuits not shown in the drawing.

The gains of the first and second differential amplifiers are automatically adjusted by the AGC circuit by means of the two direct voltages V1 and V2, whose magnitudes depend on the average level of the radio frequency input signal. Voltage V1 acts on the first differential amplifier circuit modifying the operating conditions of the two transistors T1 and T2, while voltage V2 acts on the second differential amplifier circuit varying the conduction of transistor T7 and therefore the current that it supplies to the circuit. In particular, as the average level of the input signal increases, voltages V1 and V2 decrease, causing, as can be easily ascertained, a decrease of the emitter currents of the transistors of the two differential amplifiers and consequently the gains of the amplifiers.

Resistors R7 and R8 are selected so that transistors T12 and T13 will not conduct until voltage V1 applied from the AGC circuit at the first differential amplifier circuit input terminal is again large enough to guarantee a linear response. When the input signal level is high enough to cause a further reduction of voltage V1 through the AGC circuit, transistors T12 and T13 start conducting, and shunt between input terminals and output terminals the circuit formed by the cascade connection of the first and second differential amplifier circuits. The shunting effect increases as the signal level increases, while the gain of the two cascade differential amplifier circuits decreases, until the differential amplifier circuits become completely inactive and the signal is inserted into the mixer circuit only through the two transistors T12 and T13. As stated earlier, the two transistors T12 and T13 form an attenuator stage for the input signal that can also reach very high levels without distortion. In practice these levels are limited by biasing conditions and, in particular, by reference voltages Vr1 and Vr2.

However, adopting the solution described above, when responding to signal level variations that cause one of the input stages to be deactivated and the other to be activated, the device behaves in nonlinear fashion, thereby causing distortion of the signal. In addition, discontinuity in the gain is produced that entails a lowering of the output signal level. Such drawbacks can theoretically be avoided by accurately adjusting the parameters defining the switching off and on of the two input stages, but the spread of circuit component parameter values, noticeable in volume production of integrated circuits, makes these drawbacks inevitable, frustrating design accuracy.

Figure 2:
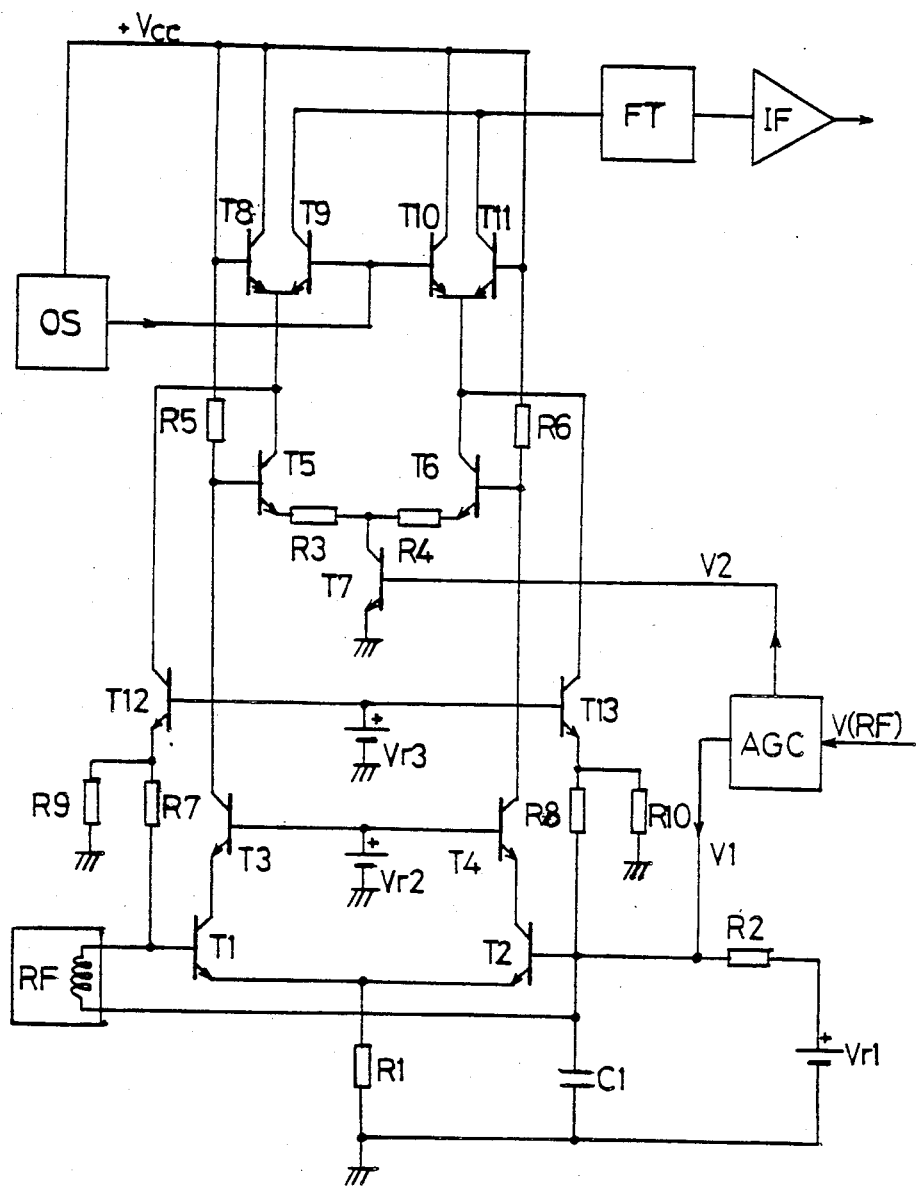
FIG. 2 shows a circuit diagram of the amplifier circuit and mixer circuit input stage represented in FIG. 1, modified according to the present invention.

The way a circuit of the type represented in FIG. 1 works responding to input signal level variations which cause the preference of one signal path or the other, is much improved, according to the present invention, by the addition of a few components, As shown in FIG. 2, these components are two resistors, indicted by R9 and R10 and a reference voltage supply Vr3. In the circuit configuration represented in FIG. 2, the emitters of the two attenuator input stage transistors T12 and T13 are coupled to a terminal at ground potential through resistors R9 and R10 respectively. The bases of transistors T12 and T13 are coupled to the positive terminal of the reference voltage supply Vr3. The value of reference voltage Vr3 and the value of resistors R9 and R10 are selected to keep the base/emitter junctions of attenuator stage transistors T12 and T13 biased directly, therefore causing these transistors always to be switched on and consequently working in a class A mode. This stage, therefore, has a predetermined and constant attenuation coefficient. When the average input signal level is still fairly low, this signal is amplified by the high gain input stage, including the two cascade differential amplifier circuits, while the auxiliary input stage attenuates a signal which is already low, and consequently its effect is negligible As the average level of the input signal increases, the AGC circuit reduces voltages V1 and V2. Therefore, there is a decrease in the gain of the amplifier input stage until this is deactivated for very high input signals. The input signal is therefore inserted into the mixer circuit only through the attenuator stage. Therefore, this signal can reach very high levels, within limits compatible with operating conditions, without suffering any distortion. As mentioned above, this input stage is always switched on and works with predetermined attenuation parameters. No nonlinear phenomena can appear, nor is there any gain discontinuity in the state in which the amplifier stage is cut off and only the attenuator stage remains switched on. Signal distortions and decreases of output signal level that would occur in the activation (or deactivation) transients of the attenuator stage are thus avoided.

It should also be noted that the circuit according to the invention, represented in FIG. 2, is particularly advantageous in that it permits the use of lower supply voltages than those required for the circuit in FIG. 1. The elements limiting supply voltage values in the circuits represented in FIG. 1 and FIG. 2 will now be analyzed.

Direct voltage V1, generated by the AGC block, is determined in the design in such a way that as the input signal level increases, the direct voltage V1 goes from a maximum value approximately equal to $2V_{BE}$, corresponding to the maximum gain of the first differential stage, to a minimum value approximately equal to $1V_{BE}$, corresponding to the deactivation of this stage.

Resistors R7 and R8, in the circuit configuration of FIG. 1, have values to keep transistors T12 and T13 inactive until the input signal level is above a certain value. When transistors T12 and T13 are conducting the values cause a voltage drop of about $1V_{BE}$ at each of the two resistors R7 and R8.

As a result, the referent source Vr2 must supply a voltage approximately equal to $3V_{BE}$ in order for transistors T12 and T13 to be able to conduct. The supply voltage must also be sufficiently higher than the voltage of the reference source Vr2 to compensate for voltage drops that occur in the various sections identifiable in the circuit of FIG. 1 and containing the source Vr2 and power $V_{cc}$. With a proper selection of the circuit components such as resistors and transistors, and selecting, where necessary, the transistors' rest points to the limit of the active zone near saturation, the supply voltage can be kept within values of about 2 Volts. However, for proper operation of the receiving circuit, lower values are not possible.

According to the principle of the invention, however, in the circuit configuration of FIG. 2, by careful selection of resistors R9 and R10, transistors T12 and T13 can function when the reference source Vr3 supplies a voltage value of approximately $2V_{BE}$, the voltage being equal on each leg of the attenuator stage to the sum of the voltage drops on the base/emitter junction of the related transistor and the voltage drop across the ground connection resistor. Likewise, if the quiescent operating point of transistors T1 and T1 is brought to the limit of the active zone near saturation, in order that the first differential stage conducts is sufficient for the reference source Vr2 to supply a voltage of approximately $2V_{BE}$. Therefore, by adequately selecting resistors R5 and R6 and causing transistors T3 and T4 to also operate close to the limit of the active zone near saturation, the system of FIG. 2 can work with a supply voltage of approximately 1.5 Volt, i.e., lower than the one of the circuit in FIG. 1.

Finally it should be noted that another way of implementing the invention can be accomplished by using a single attenuator leg instead of a symmetrically structured attenuator stage. Obviously such a solution can be adopted when it is necessary to reduce to the utmost the number of components and when a slight worsening of the signal/noise ratio is acceptable.

It will be clear to those skilled in the art that npn transistors can be replaced by pnp transistors and field-effect transistors can be used in place of bipolar transistors for one or more of the transistors shown and described.

The above description is included to illustrate the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A transistor amplifier and mixer circuit input stage for a receiver of radio frequency signals comprising:
    a differential amplifier (T1-T4) having differential input terminals coupled to output terminals of a radio frequency signal generator (RF), said differential amplifier having a regulating terminal coupled to an AGC circuit of said receiver, said AGC circuit adapted to generate at least one voltage (V1,V2) varying as a function of the average level of the radio frequency signal, said at least one voltage automatically adjusting said differential amplifier gain;
    a mixer circuit (T5-T11) having a first input coupled to output terminals of said differential amplifier (T1-T4), said mixer circuit having a second input coupled to an oscillator (OS) and a output which is a stage output;
    an attenuator (T12, T13, R7-R10) coupled between said output terminal at said radio frequency signal generator (RF) and said mixer circuit (T5-T11), said attenuator having a predetermined attenuation coefficient, said attenuator having resistor means including at least four resistors for establishing said predetermined attenuation coefficient that is fixed by a ratio of the values of said four resistors (R8, R10 and R7, R9) and also for providing an attenuation coefficient that is substantially constant for all levels of said radio frequency signal, said attenuator being active at all levels of input signal.

2. The input stage according to claim 1, wherein said output terminals of said radio frequency signal generator (RF) are short circuited for direct current, said regulating terminal coinciding with one of said input terminals of said differential amplifier (T1-T4), said mixer circuit (T5-T11) including a differential input stage (T4-T7), and said attenuator (T12, T13, R7-R10) including at least one transistor (T12, T13), said transistor having an emitter coupled via a resistor (R7, R8) to said radio frequency (RF) signal generator output terminal, said transistor having a collector coupled to an output terminal of said mixer differential input stage (T5-T7); said transistor being also coupled to circuit means capable of directly biasing a base/emitter junction of said transistor.

3. An amplifier and mixer circuit for radio frequency signals comprising:
    amplifier means for amplifying said radio frequency signals;
    attenuation means for attenuating said radio frequency signals, said attenuation means being operative for all levels of said radio frequency signals, said attenuation means having resistor means including at least four resistors for establishing a predetermined attenuation coefficient that is fixed by a ratio of the values of said resistors and also for providing an attenuation coefficient that is substantially constant for all levels of said radio frequency signals; and mixer means combining output signals of said amplifier means and said attenuation means, said attenuation means applying a signal to said mixer means for all levels of said radio frequency signals.

4. The amplifier and mixer circuit of claim 3 wherein a gain of said amplifier means is controlled by an automatic gain control circuit, said attenuation means being comprised of at least one transistor, wherein said at least one attenuation transistor is biased independently of said amplifier means, and wherein the emitter of said transistor is coupled to a ground terminal through a resistor.

5. In a radio frequency transistor amplifier circuit/mixer circuit state, wherein said amplifier circuit includes a first pair of cascaded differential amplifier circuits and said mixer circuit includes a second pair of cascaded differential amplifier circuits, an attenuation circuit comprising:

at least one transistor coupled between emitters of said differential amplifier pair of said mixer circuit;

a voltage source for biasing said transistor independently of said amplifier circuit; and resistor means including at least four resistors for establishing a predetermined attenuation coefficient that is fixed by a ratio of the values of said four resistors and also for providing an attenuation coefficient that is substantially constant for all levels of said radio frequency signals.

6. A method for controlling a transistor amplifier/mixer circuit having an attenuator circuit and an amplifier circuit coupled to a mixer circuit, wherein said attenuator circuit has transistors having base terminals resistively coupled to base terminals of a transistor pair of said amplifier circuit, said attenuator circuit transistors having terminals coupled through resistors to base terminals of a diffamp of said amplifier circuit, the method of providing that said attenuator circuit operates for all values of input voltage comprising the steps of:

coupling said attenuator circuit transistors terminals to ground potential;

biasing said attenuator circuit transistors independently of said amplifier transistor pair; and providing resistor means including at least four resistors for establishing a predetermined attenuation coefficient that is fixed by a ratio of the values of said four resistors and also for providing an attenuation coefficient that is substantially constant for all levels of said radio frequency signals.

7. A transistor amplifier/mixer circuit for processing a radio frequency signal, said amplifier mixer circuit coupled to an automatic gain control device, said amplifier/mixer circuit comprising:

mixer circuit means for combining an oscillator signal and said radio frequency signal;

amplifier means for amplifying said radio frequency signal and applying said amplified signal to said mixer, a gain of said amplifier means controlled by said automatic gain control device; and attenuation means for attenuating said radio frequency signal at all levels of said radio frequency signal and applying said attenuated signal to said mixer circuit means, said attenuating means further including biasing means for enabling said attenuation means to operate for all levels of said radio frequency signal, said attenuation means also having resistor means including at least four resistors for establishing a predetermined attenuation coefficient that is fixed by a ratio of the values of said four resistors and also for providing an attenuation coefficient that is substantially constant for all levels of said radio frequency signals.

8. The transistor amplifier/mixer circuit of claim 7 wherein said biasing means includes an independent voltage source means for biasing a base terminal of at least one transistor.

9. The transistor amplifier/mixer circuit of claim 7 wherein said biasing means includes coupling at least one transistor to a ground potential and to an input terminal of said amplifier means.

10. A method for controlling a transistor amplifier circuit-mixer circuit for radio frequency signals, wherein said amplifier circuit includes a diffamp for receiving said radio frequency signal, said diffamp of said circuit having an output signal coupled to a diffamp of said mixer circuit, said amplifier circuit having intermediate transistors coupled between transistor of said diffamp and said mixer circuit diffamp, said amplifier circuit having an attenuating transistor coupled to said mixer circuit diffamp for applying an attenuated signal thereto, said attenuating transistor attenuating at all levels of input of said radio frequency signals, the method of operating said amplifier circuit-mixer circuit comprising the step of:

applying said attenuated signal to said mixer circuit for all magnitudes of radio frequency signals; and providing resistor means including at least four resistors for establishing a predetermined attenuation coefficient that is fixed by a ratio of the values of said four resistors and also for providing an attenuation coefficient that is substantially constant for all levels of said radio frequency signals.

11. The method of controlling an amplifier circuit-mixer circuit of claim 10 wherein the applying step includes the step of biasing said attenuating transistors independent of the bias of said intermediate transistors and includes the step of coupling emitters of said attenuating transistors to ground potential.

12. In a transistor amplifier/mixer circuit for radio frequency signals, wherein an amplifying portion of said amplifier circuit amplifies a low level radio frequency signal and applies said amplified low level radio frequency signal to said mixer, wherein an attenuating portion of said amplifier circuit attenuates higher level radio frequency signals and applies said higher level radio frequency signals to said mixer circuit, said attenuating portion coupled to said amplifying portion, an attenuator circuit for attentuating said radio frequency signal over the entire range of signal amplitudes comprising:

means for coupling said attenuating portion simultaneously to a ground potential and to said radio frequency signal;

means for determining attenuator portion operating conditions independent of amplifying portion operating conditions; and said attenuator having resistor means including at least four resistors for establishing a predetermined attenuation coefficient that is fixed by a ratio of the values of said four resistors and also for providing an attenuation coefficient that is substantially constant for all levels of said radio frequency signals.

13. A transistor amplifier/mixer circuit for radio frequency signals comprising:
   amplifier means for amplifying low level radio frequency signals;
   attenuator means for attenuating all levels of radio frequency signals, said attenuator means having resistor means including at least four resistors for establishing a predetermined attenuation coefficient that is fixed by a ratio of the values of said four resistors and also for providing an attenuation coefficient that is substantially constant for all levels of said radio frequency signals; and
   mixer means for combining said amplified low level radio frequency signals and said attenuated radio frequency signals.

14. The transistor amplifier/mixer circuit of claim 13 wherin said attenuator means includes means for coupling a base of at least one transistor to an independent voltage source and means for resistively coupling a biasing terminal of said transistor to said radio frequency signal and to a ground potential.

* * * * *